US010627850B1

(12) United States Patent
Lopez et al.

(10) Patent No.: US 10,627,850 B1
(45) Date of Patent: Apr. 21, 2020

(54) FREQUENCY SYNTHESIS SYSTEMS

(71) Applicant: VIASAT, INC., Carlsbad, CA (US)

(72) Inventors: Noel A. Lopez, Chandler, AZ (US); David R. Saunders, Scottsdale, AZ (US)

(73) Assignee: VIASAT, INC., Carlsbad, CA (US)

( * ) Notice: Subject to any disclaimer, the term of this patent is extended or adjusted under 35 U.S.C. 154(b) by 0 days.

(21) Appl. No.: 16/411,884

(22) Filed: May 14, 2019

(51) Int. Cl.
*G06F 1/03* (2006.01)
*H03M 1/66* (2006.01)
*G06F 1/02* (2006.01)

(52) U.S. Cl.
CPC ............ *G06F 1/0321* (2013.01); *G06F 1/022* (2013.01); *H03M 1/66* (2013.01)

(58) Field of Classification Search
CPC ......... G06F 1/022; G06F 1/0321; H03M 1/66
USPC .......................................... 327/105, 106, 107
See application file for complete search history.

(56) References Cited

U.S. PATENT DOCUMENTS

| | | | |
|---|---|---|---|
| 5,039,872 A * | 8/1991 | Oldham | G01R 31/2841 327/106 |
| 7,911,247 B2 | 3/2011 | Xu et al. | |
| 8,509,354 B2 | 8/2013 | Fudge et al. | |
| 9,628,262 B1 | 4/2017 | Moe | |
| 2001/0033200 A1 | 10/2001 | Staszewski et al. | |
| 2005/0001747 A1 * | 1/2005 | Kuyel | H03M 1/1038 341/118 |
| 2007/0067123 A1 * | 3/2007 | Jungerman | G06F 1/0321 702/67 |

OTHER PUBLICATIONS

Rode et al.: "Fractional-N Direct Digital Frequency Synthesis with a 1-Bit Output"; 2006 IEEE MTT-S International Microwave Symposium Digest; DOI: 10.1109/MWSYM.2006.249559; p. 415-418.
Hoekstra: "Frequency Modulation of system Clocks for EMI Reduction"; Aug. 1997 Hewlett-Packard Journal; Article 13; pp. 1-7.
"Direct digital synthesis"; Wikipedia; Nov. 6, 2018; https://en.wikipedia.org/wiki/Direct_digital_synthesis; pp. 1-3.
Toeppen: "Acquisition Clock Dithering in a Digital Oscilloscope"; Apr. 1997 Hewlett-Packard Journal; pp. 1-7.

(Continued)

*Primary Examiner* — William Hernandez
(74) *Attorney, Agent, or Firm* — Tarolli, Sundheim, Covell & Tummino LLP

(57) ABSTRACT

A frequency synthesis system includes a memory to store first and second digital control word pairs that each include a first and second control word. A first DAC system generates an analog sampling signal having a first sampling frequency based on a fixed clock signal and the first control word of the first pair during a first time duration having a second sampling frequency based on the first control word of the second pair during a second time duration. A second DAC system generates an analog output signal based on the second control word of the first pair and the first sampling frequency at the first time duration and based on the second control word of the second pair and the second sampling frequency at the second time duration. The analog output signal has a same predetermined output frequency at both the first and second time durations.

20 Claims, 6 Drawing Sheets

(56) References Cited

OTHER PUBLICATIONS

Sotiriadis, et al.: "Direct All-Digital Frequency Synthesis Techniques, Spurs Suppression, and Deterministic Jitter Correction": IEEE Transactions on Circuits and Systems—I: Regular Papers, vol. 59, No. 5, May 2012; pp. 958-968.
Analog Devices: "Fundamentals of Direct Digital Synthesis (DDS)"; Rev.0, Oct. 2008, WK; pp. 1-9.
Sotiriadis, et al.2: "Single-Bit Digital Frequency Synthesis via Dithered Nyquist-rate Sinewave Quantization"; ircuits and Systems I: Regular Papers, IEEE Transactions on. 61. 61-73. 10.1109/TCSI.2013.2268297.
Chen, et al.: "A digital-to-frequency synthesizer with clock dithering"; Article in Analog Integrated Circuits and Signal Processing—Mar. 2012 DOI: 10.1007/s10470-012-9992-7; pp. 1-12.

\* cited by examiner

FREQUENCY SYNTHESIS SYSTEMS

TECHNICAL FIELD

This disclosure relates generally to circuit systems, and specifically to frequency synthesis systems.

BACKGROUND

Modern computer architecture requires digital manipulation of data, such as to process information via digital processors. Signals that are transmitted between electronic components and/or devices are provided in an analog form (e.g., including wireless and/or broadband signals). Therefore, digital-to-analog converters (DACs) are used to generate analog signals from digital inputs, such as for transmission of the analog signals (e.g., as a carrier signal for a communications signal or as a timing reference). The analog signals generated at a given frequency (f) that can included some inherent alias products produced. For example, the alias products at the sampling frequency (Fs) plus or minus the desired frequency (Fs+/−f) can be the largest (e.g., highest power) such alias products. Typically, the analog signal at either frequency f (1st Nyquist zone), Fs−f (2nd Nyquist zone), or Fs+f (3rd Nyquist zone) is desired, while other frequencies, including those at additional Nyquist zones, can require filtering to achieve the desired performance without deleterious effects.

SUMMARY

One example includes a frequency synthesis system. The system includes a memory to store first and second digital control word pairs that each include a first and second control word. A first DAC system generates an analog sampling signal having a first sampling frequency based on a fixed clock signal and the first control word of the first pair during a first time duration having a second sampling frequency based on the first control word of the second pair during a second time duration. A second DAC system generates an analog output signal based on the second control word of the first pair and the first sampling frequency at the first time duration and based on the second control word of the second pair and the second sampling frequency at the second time duration. The analog output signal has a same predetermined output frequency at both the first and second time durations.

Another example includes a method for generating an analog output signal via a frequency synthesis system. The method includes generating a fixed clock signal and providing a first address signal to a memory based on a count value of a counter that is incremented via the fixed clock signal to provide a first control word and a second control word associated with a first digital control word pair from the memory during the first time duration. The method also includes providing a second address signal to the memory based on the count value of the counter to provide a third control word and a fourth control word associated with a second digital control word pair from the memory during the second time duration. The first and second digital control word pairs can each be associated with a predetermined output frequency. The method also includes generating a first analog sampling signal having a first frequency via a first digital-to-analog converter (DAC) system based on the first control word and based on a sampling frequency defined by a fixed clock signal during the first time duration. The method also includes generating the analog output signal at the predetermined output frequency via a second DAC system based on the second control word and based on a sampling frequency defined by the first analog sampling signal during the first time duration. The method also includes generating a second analog sampling signal having a second frequency via the first DAC system based on the third control word and based on the sampling frequency defined by the fixed clock signal during the second time duration. The second frequency can be different from the first frequency. The method further includes generating the analog output signal at the predetermined output frequency via the second DAC system based on the fourth control word and based on a sampling frequency defined by the second analog sampling signal during the second time duration.

Another example includes a frequency synthesis system. The system includes a counter comprising a count value that is incremented based on a predetermined number of cycles of a fixed clock signal to define and cycle between a plurality of time durations. The system also includes a memory coupled to receive address signals from the counter, the address signals being associated with accessing a plurality of a digital control word pairs stored in the memory, each of the digital control word pairs comprising a first control word and a second control word, the first and second control words for each of the digital control word pairs having respective different values relative to other digital control word pairs and being associated with a same predetermined output frequency. The system also includes a first numerically controlled oscillator (NCO) coupled to receive a fixed clock signal from a clock and to receive the first control word from each of the digital control word pairs in each of the respective plurality of time durations in a sequence to generate a first digital signal. The system also includes a first digital to analog converter (DAC) coupled to receive the first digital signal to generate an analog sampling signal, the analog sampling signal having a different frequency during each of the plurality of time durations in the sequence. The system also includes a second NCO to generate a second digital signal based on the second control word of the first and second digital control word pairs in each of the first time duration and the second time duration, respectively, and based on the analog sampling signal. The system further includes a second DAC to generate an analog output signal at a predetermined output frequency in both of the first and second time durations based on the second digital signal.

DETAILED DESCRIPTION

Figure 1:
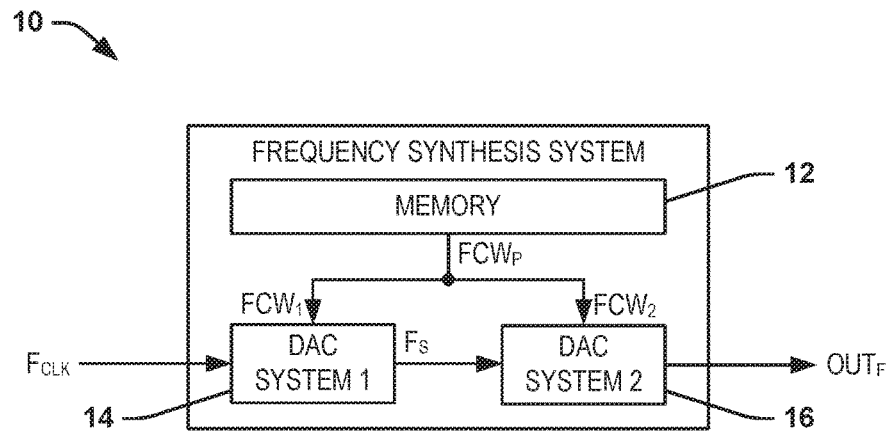
FIG. 1 illustrates an example diagram of a frequency synthesis system.

This disclosure relates generally to circuit systems, and specifically to frequency synthesis systems. The synthesis system includes a memory that can be configured to store a first digital control word pair and a second digital control word pair. Each of the digital control word pairs can include a first control word and a second control word that collectively define a predetermined output frequency of an associated analog output signal. As an example, each of the first and second control words can correspond to step-sizes for a phase accumulator to step through a lookup table to provide an associated analog output signal, as described in greater detail herein. For example, the memory can be configured as a read-only memory (ROM), or any of a variety of other types of memory devices.

The frequency synthesis system can include a first digital-to-analog converter (DAC) system and a second DAC system. Each of the DAC systems can be arranged as a numerically-controlled oscillator (NCO) and a DAC, such that the NCO receives one of the control words and generates an analog signal based on a phase-to-amplitude accumulated digital value from the control word via the DAC at a sampling rate defined by an analog signal. For example, the first DAC system can receive the first control word of each of the first and second digital control word pairs in respective first and second time durations to generate an analog sampling signal based on a sampling rate defined by a fixed clock signal, which can be an analog or digital clock signal. As described herein, the term "fixed clock signal" refers to a clock signal having a static predefined frequency, such as provided via a crystal oscillator. Therefore, the analog sampling signal can have a first sampling frequency during the first time duration and can have a second sampling frequency during the second time duration.

The second DAC system can thus receive the second control word of each of the first and second digital control word pairs in respective first and second time durations to generate an analog output signal based on a sampling rate defined by the analog sampling signal. Therefore, the analog output signal can be provided at the predetermined output frequency at each of the first and second time durations, but based on the first sampling frequency during the first time duration and based on the second sampling frequency during the second time duration. Accordingly, the analog output signal can be generated based on a dithered sampling frequency to substantially mitigate a power density associated with multiple Nyquist zones outside of the first Nyquist zone. As a result, filtering of alias products can be achieved in a much more efficient manner. Additionally, the frequency synthesis system can allow for generation of the analog output signal to be in the second or a higher Nyquist zone, such as to allow for generation of an analog signal at a higher frequency based on relatively lower sampling frequencies (e.g., lower than the Nyquist frequency).

FIG. 1 illustrates an example of a frequency synthesis system 10. The frequency synthesis system 10 can be implemented in any of a variety of computer applications to generate an analog output signal, demonstrated in the example of FIG. 1 as a signal "$OUT_F$", at a desired output frequency. For example, the analog output signal $OUT_F$ can be provided to generate a carrier signal on which a baseband communication signal can be modulated, or can generate a timing reference signal that can be implemented for a variety of reasons in a computer system. As described in greater detail herein, the frequency synthesis system 10 can generate the analog output signal $OUT_F$ in a manner that substantially reduces a power density of spurious alias signals that can be generated, such as to provide for a more efficient filtering of the analog output signal $OUT_F$.

The frequency synthesis system 10 can include a memory 12 that is configured to store digital control word pairs, demonstrated in the example of FIG. 1 as "$FCW_P$", that are each associated with a predetermined frequency of the analog output signal $OUT_F$. For example, the memory 12 can be configured as a read-only memory (ROM), or any of a variety of other types of memory devices. The digital control word pairs $FCW_P$ can each include a first frequency control word (hereinafter "control word") $FCW_1$ and a second control word $FCW_2$. For example, each of the control words $FCW_1$ and $FCW_2$ can correspond to step-sizes for a phase accumulator to step through a phase-to-amplitude lookup table (LUT) to provide an associated analog output signal, as described in greater detail herein. As described herein, the discussion of digital control word pairs $FCW_P$ is with respect to a first digital control word pair $FCW_P$ and a second digital control word pair $FCW_P$. However, it is to be understood that the memory 12 can be configured to store more than two digital control word pairs $FCW_P$ that can all be associated with a given predetermined output frequency of the analog output signal $OUT_F$.

In the example of FIG. 1, the frequency synthesis system 10 also includes a first digital-to-analog converter (DAC) system 14 and a second DAC system 16. The first DAC system 14 is configured to generate an analog sampling signal $F_S$ having a sampling frequency that is based on a fixed clock signal, designated as a signal $F_{CLK}$, and based on the first control word $FCW_1$ of each of the digital control word pairs $FCW_P$ at separate respective time durations. For example, the first DAC system 14 is configured to receive the first control word $FCW_1$ of the first digital control word pair $FCW_P$ to generate the analog sampling signal $F_S$ at a first sampling frequency during a first time duration, and to receive the first control word $FCW_1$ of the second digital control word pair $FCW_P$ to generate the analog sampling signal $F_S$ at a second sampling frequency during a second time duration. As described in greater detail herein, the memory 12 can alternate between the first and second time durations, such that the analog sampling signal $F_S$ alternates between the first and second sampling frequencies.

The time durations can each correspond to a plurality of periods of the fixed clock signal $F_{CLK}$, such as between two periods and approximately one thousand periods of the fixed clock signal $F_{CLK}$. For example, the time durations can correspond to a shorter number of periods of the fixed clock signal $F_{CLK}$ relative to an integration time associated with an associated receiver in which the frequency synthesis system 10 can be implemented. For example, in communication systems and/or radar systems, the number of periods of the fixed clock signal $F_{CLK}$ can correspond to time durations much shorter than a symbol time or a pulse repetition interval. As another example, the time durations are not limited to being equal in length with respect to the number of periods of the fixed clock signal $F_{CLK}$.

The second DAC system 16 is configured to generate the analog output signal $OUT_F$ at the predetermined output frequency at each of the first and second time durations. In the example of FIG. 1, the second DAC system 16 can generate the analog output signal $OUT_F$ based on the analog sampling signal $F_S$ and based on the second control word $FCW_2$ of each of the digital control word pairs $FCW_P$ at each of the separate respective time durations. As an example, the analog sampling signal $F_S$ can be converted to a digital signal before being provided to the second DAC system 16, such that the second DAC system 16 can be configured to generate the analog output signal $OUT_F$ based on a digital version of the analog sampling signal $F_S$. For example, the second control word $FCW_2$ can be inversely proportional to the first control word $FCW_1$, such that the analog output signal $OUT_F$ can have the same predetermined output frequency at each of the time durations despite the changes in the sampling frequency of the analog sampling signal at each of the respective time durations. Accordingly, the analog output signal $OUT_F$ can be generated based on dithering between the first and second sampling frequencies to substantially mitigate a power density associated with multiple Nyquist zones outside of the first Nyquist zone associated with the predetermined output frequency. As a result, filtering of alias frequencies via filters (not shown) can be achieved in a much more efficient manner. Additionally, the frequency synthesis system 10 allows for generation of the analog output signal $OUT_F$ to be in the second or a higher Nyquist zone, such as to allow for generation of an analog signal (e.g., the analog output signal $OUT_F$) at a higher frequency based on relatively lower sampling frequencies (e.g., lower than the Nyquist frequency) of the analog sampling signal $F_S$.

Figure 2:
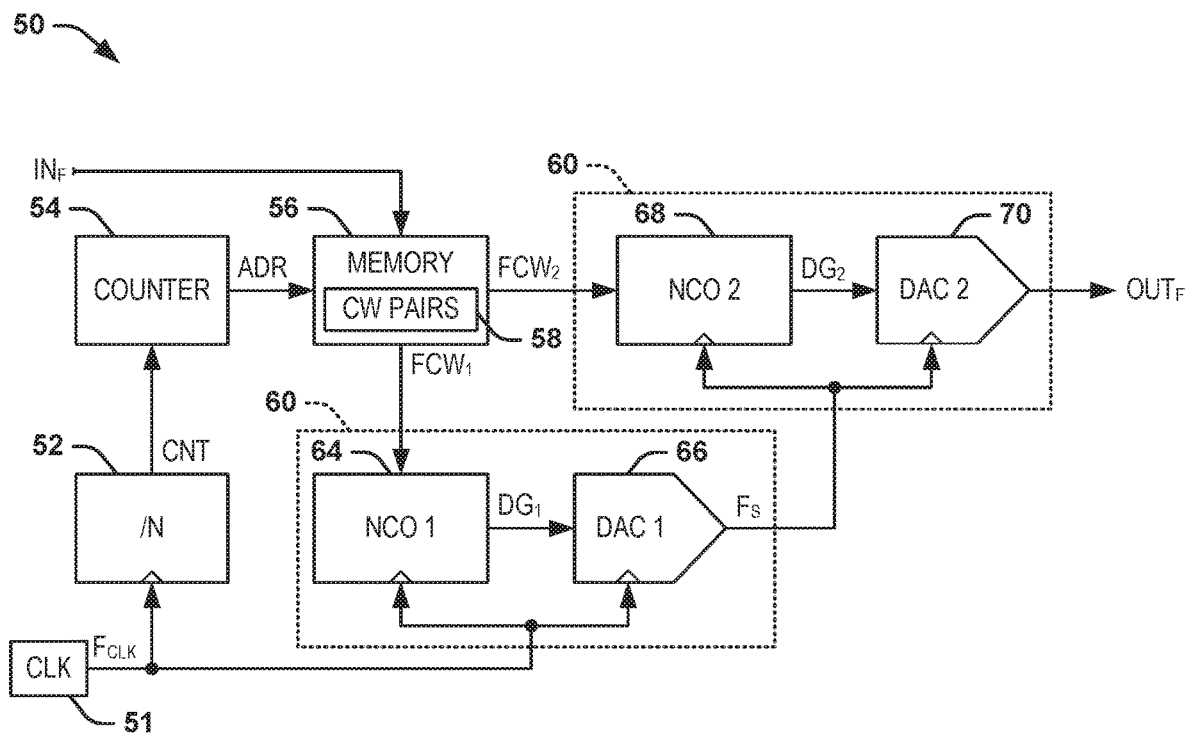
FIG. 2 illustrates another example diagram of a frequency synthesis system.

FIG. 2 illustrates another example of a frequency synthesis system 50. As an example, the frequency synthesis system 50 can correspond to an example of the frequency synthesis system 10 in the example of FIG. 1. Therefore, similar to as described previously, the frequency synthesis system 50 can be implemented in any of a variety of computer applications to generate an analog output signal $OUT_F$ at an output of the frequency synthesis system 50.

The frequency synthesis system 50 includes a clock 51 that is configured to generate a fixed clock signal $F_{CLK}$. The frequency synthesis system 50 also includes a trigger circuit 52 that is configured to receive the fixed clock signal $F_{CLK}$ and to generate a count signal CNT that increments at each of "N" cycles of the fixed clock signal $F_{CLK}$. The count signal CNT is provided to an input of the counter 54 that is configured to generate address signals ADR that are provided to a memory 56 at each increment of the count signal CNT. The address signals ADR are therefore received by the memory 56 to access stored digital control word pairs 58 that are each associated with a predetermined frequency of the analog output signal $OUT_F$. The digital control word pairs 58 can each include a first control word $FCW_1$ and a second control word $FCW_2$. As described previously, each of the control words $FCW_1$ and $FCW_2$ can correspond to step-sizes for a phase accumulator to step through an LUT to provide an associated analog output signal, as described in greater detail herein.

As an example, the counter 54 can include a rollover value, such that the counter 54 can alternate between address values in a sequence by returning to an initial count value, and thus a first address corresponding to a first digital control word pair 58, in response to the count value reaching a maximum value. Therefore, the counter 54 can define time durations corresponding to the respective digital control word pairs 58, and can sequentially alternate between the respective time durations corresponding to the digital control word pairs 58 that are accessed from the memory 56 via the address signals ADR. As described herein, each of the digital control word pairs 58 associated with each of the respective time durations can define a common predetermined output frequency of the analog output signal $OUT_F$.

In the example of FIG. 2, the frequency synthesis system 50 also includes a first DAC system 60 and a second DAC system 62. The first DAC system 60 is configured to generate an analog sampling signal $F_S$ having a sampling frequency that is based on the fixed clock signal $F_{CLK}$ and based on the first control word $FCW_1$ of each of the digital control word pairs 58 at the separate respective time durations that are based on the address signals ADR provided to the memory 56. In other words, the address signals ADR provided to the memory 56 dictate one of the digital control word pairs 58 that is accessed from the memory 56 by the first and second DAC systems 60 and 62 at a given time duration.

In the example of FIG. 2, the first DAC system 60 includes a numerically-controlled oscillator (NCO) 64 and a DAC 66. In response to a first address signal ADR provided from the counter 54 to the memory 56, the NCO 64 receives a first control word $FCW_1$ of a first digital control word pair 58 at an input of the NCO 64 in the respective first time duration to generate the analog sampling signal $F_S$ at a first sampling frequency based on the fixed clock signal $F_{CLK}$ being received at a clock input of the NCO 64. Similarly, in response to a second address signal ADR provided from the counter 54 to the memory 56, the NCO 64 receives a first control word $FCW_1$ of a second digital control word pair 58 at the input of the NCO 64 in the respective second time duration to generate the analog sampling signal $F_S$ at a second sampling frequency based on the fixed clock signal $F_{CLK}$ received at the clock input of the NCO 64. The memory 56 can thus alternate between the first and second time durations, such that the analog sampling signal $F_S$ alternates between the first and second sampling frequencies. Similar to as described previously, the memory 56 can, for example, store more than two digital control word pairs 58 corresponding to respective additional time durations, and thus additional sampling frequencies.

The NCO 64 thus provides a digital signal $DG_1$ to an input of the DAC 66, such that the DAC 66 generates an analog representation of the digital signal $DG_1$ at an output of the DAC 66 based on the fixed clock signal $F_{CLK}$ that is received at a clock input of the DAC 66. Thus, the analog representation of the digital signal $DG_1$ can correspond to the analog sampling signal $F_S$. For example, the NCO 64 can include a phase accumulator and an LUT, such that the first control word $FCW_1$ can correspond to a step-size of phase values corresponding to a predetermined digital representation of a signal (e.g., a sinusoid) stored in the LUT. Therefore, the phase accumulator can increment the phase values associated with the LUT by the step-size defined by the first control word $FCW_1$ at each cycle of the fixed clock signal $F_{CLK}$, such that the DAC can provide an analog reconstruction of the corresponding amplitudes output from the LUT.

The second DAC system 62 is configured to generate the analog output signal $OUT_F$ at the predetermined output frequency that is based on the analog sampling signal $F_S$ and based on the second control word $FCW_2$ of each of the digital control word pairs 58 at the separate respective time durations that are based on the address signals ADR provided to the memory 56. As an example, the analog sampling signal $F_S$ can be converted to a digital signal before being provided to the second DAC system 62 (e.g., via a DAC, not shown), such that the second DAC system 16 can be configured to generate the analog output signal $OUT_F$ based on a digital version of the analog sampling signal $F_S$. In the example of FIG. 2, the second DAC system 62 includes an NCO 68 and a DAC 70.

In response to the first address signal ADR provided from the counter 54 to the memory 56, the NCO 68 receives a second control word $FCW_2$ of the first digital control word pair 58 at an input of the NCO 68 in the respective first time duration to generate the analog output signal $OUT_F$ based on the first sampling frequency of the analog sampling signal $F_S$ received at a clock input of the NCO 68. Similarly, in response to the second address signal ADR provided from the counter 54 to the memory 56, the NCO 68 receives a second control word $FCW_2$ of the second digital control word pair 58 at the input of the NCO 68 in the respective second time duration to generate the analog output signal $OUT_F$ based on the second sampling frequency of the analog sampling signal $F_S$ received at the clock input of the NCO 68.

The NCO 68 thus provides a digital signal $DG_2$ to an input of the DAC 70, such that the DAC 70 generates an analog representation of the digital signal $DG_2$ based on the analog sampling signal $F_S$ that is received at a clock input of the DAC 70. Thus, the analog representation of the digital signal $DG_2$ can correspond to the analog output signal $OUT_F$. For example, similar to the NCO 64, the NCO 68 can include a phase accumulator and an LUT, such that the second control word $FCW_2$ can correspond to a step-size of phase values corresponding to a predetermined digital representation of a signal (e.g., a sinusoid) stored in the LUT. Therefore, the phase accumulator can increment the phase values associated with the LUT by the step-size defined by the second control word $FCW_2$ at each cycle of the analog sampling signal $F_S$, such that the DAC can provide an analog reconstruction of the corresponding amplitudes output from the LUT.

Therefore, based on inverse proportionality of the first and second control words $FCW_1$ and $FCW_2$, the analog output signal $OUT_F$ can have the same predetermined output frequency at each of the time durations despite the changes in the sampling frequency of the analog sampling signal $F_S$ at each of the respective time durations. Accordingly, the analog output signal $OUT_F$ can be generated based on dithering between the first and second sampling frequencies to substantially mitigate a power density associated with multiple Nyquist zones outside of the first Nyquist zone associated with the predetermined output frequency. As a result, filtering of alias frequencies via filters (not shown) can be achieved in a much more efficient manner. Additionally, the frequency synthesis system 50 allows for generation of the analog output signal $OUT_F$ to be in the second or a higher Nyquist zone, such as to allow for generation of an analog signal (e.g., the analog output signal $OUT_F$) at a higher frequency based on relatively lower sampling frequencies (e.g., lower than the Nyquist frequency) of the analog sampling signal $F_S$.

In addition, in the example of FIG. 2, the memory 56 is configured to receive an input $IN_F$ that can correspond to programmable digital control word pairs that can be input to the memory 56, and can thus be stored as sets of the digital control word pairs 58. Therefore, each of the sets of digital control word pairs 58 can have two or more digital control word pairs 58 that are each associated with a respective two or more time durations between which the frequency synthesis system 50 can sequentially alternate with respect to the sampling frequency of the analog sampling signal $F_S$. For example, the digital control word pairs 58 can include multiple sets of digital control word pairs, with each of the sets being associated with a separate respective predetermined output frequency that is desired for the analog output signal $OUT_F$. As an example, the input $IN_F$ can correspond to additional sets of digital control word pairs to be stored in the memory 56 that define a given output frequency of the analog output signal $OUT_F$, and/or can include a selection input that corresponds to a given set of digital control word pairs 58 already stored in the memory 56 to define the given output frequency of the analog output signal $OUT_F$. Additionally, the input $IN_F$ can be provided, for example, from a processor (not shown) that is configured to automatically generate the first and second control words $FCW_1$ and $FCW_2$ for each of the digital control word pairs in a given set of digital control word pairs, such as based on an input to the processor that defines a desired output frequency for analog output signal $OUT_F$. Therefore, the frequency synthesis system 50 can be programmable via the input $IN_F$ to define the predetermined output frequency at which the analog output signal $OUT_F$ is provided to provide versatility of operation of the frequency synthesis system 50.

Figure 3:
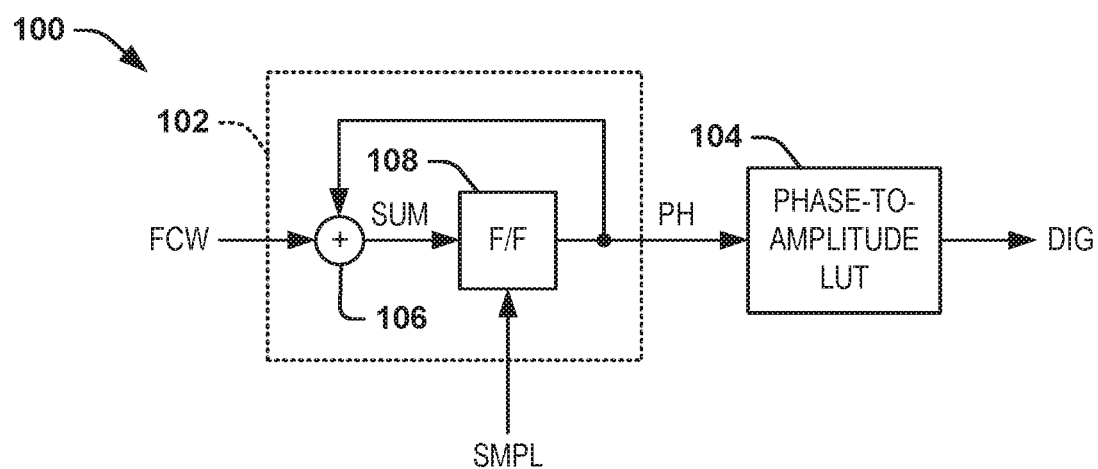
FIG. 3 illustrates an example diagram of a numerically-controlled oscillator (NCO).

FIG. 3 illustrates an example diagram of an NCO 100. The NCO 100 can correspond to the NCO 64 of the first DAC system 60 or the NCO 68 of the second DAC system 62. Therefore, reference is to be made to the examples of FIGS. 1 and 2 in the following description of the example of FIG. 3.

The NCO 100 includes a phase-accumulator 102 and a phase-to-amplitude LUT 104. The phase-accumulator 102 is demonstrated as an adder (e.g., digital addition component) 106 and a flip-flop 108. The adder 106 is configured to add an input control word FCW (e.g., the first control word $FCW_1$ or the second control word $FCW_2$) and a digital phase signal PH together to provide a summation signal SUM. The summation signal SUM is provided to the flip-flop 108, such that the flip-flop 108 provides the digital phase signal PH corresponding to the summation signal SUM at each cycle of a sampling signal SMPL. For example, the sampling signal SMPL can correspond to the fixed clock signal $F_{CLK}$ for the first NCO 64 or the analog sampling signal $F_S$ for the second NCO 68. Therefore, the flip-flop 108 recursively provides the phase signal PH back to the adder 106 to provide a new value for the summation signal SUM, and also provides the phase signal PH to the phase-to-amplitude LUT 104.

For example, the phase-to-amplitude LUT 104 can be configured to store a plurality of entries that correspond to a digital representation of a predetermined signal. For example, the phase-to-amplitude LUT 104 for the first NCO 64 can store a digital representation of a sinusoidal signal (or other periodic signal, such as a cosine signal, square-wave, etc.), and the phase-to-amplitude LUT 104 for the second NCO 68 can store a digital representation of the analog output signal (e.g., a sinusoidal signal or variation thereof). Therefore, the phase signal PH can be incremented by a quantity defined by the control word FCW to access a given entry of the phase-to-amplitude LUT 104 to provide a digital sample of the respective digital signal DG. Accordingly, the DAC (e.g., the DAC 66 or 70 of the respective first and second DAC systems 62 and 64) can provide an analog quantity (e.g., voltage) of the respective digital sample at each cycle of the sampling signal SMPL (e.g., the fixed clock signal $F_{CLK}$ or the analog sampling signal $F_S$).

As described previously, the first and second control words $FCW_1$ and $FCW_2$ of each of the digital control word pairs 58 can be inversely proportional with respect to each other. As a result, each of the digital control word pairs 58 can be provided in each of the time durations to provide the analog output signal $OUT_F$ at a common predetermined frequency in all of the time durations. For example, the first control word $FCW_1$ of a first digital control word pair 58

(e.g., of a first time duration) can have a step-size that is twice a step-size of the first control word $FCW_1$ of a second digital control word pair 58 (e.g., of a first time duration). Therefore, the analog sampling signal $F_S$ can have a sampling frequency during the first time duration that is twice the frequency of the sampling frequency during the second time duration. Accordingly, in this example, the second control word $FCW_2$ of the first digital control word pair 58 can have a step-size that is half a step-size of the second control word $FCW_2$ of the second digital control word pair 58. As a result, the analog output signal $OUT_F$ can have an output frequency that is approximately equal in each of the first and second time durations based on the inversely proportional relationship of the step-size values of the first and second control words $FCW_1$ and $FCW_2$ in each of the first and second time durations.

Figure 4:
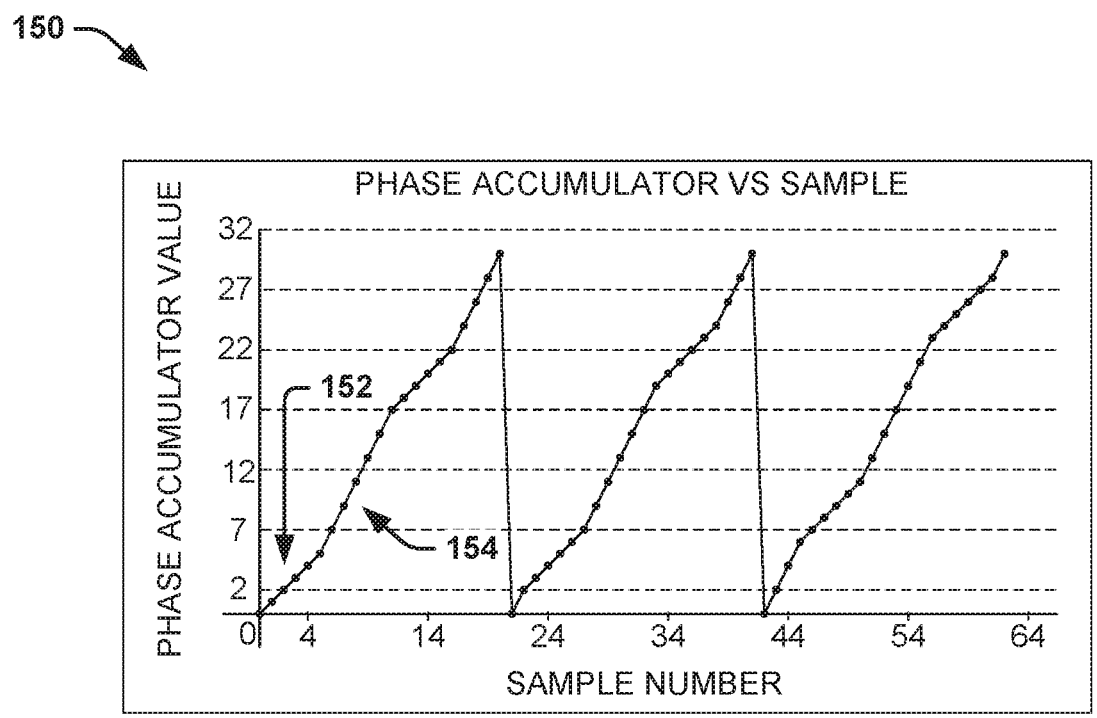
FIG. 4 illustrates an example graph of phase accumulator value versus sample for a frequency synthesis system.

FIG. 4 illustrates an example graph 150 of phase accumulator value versus sample for a frequency synthesis system (e.g., the frequency synthesis system 50). Particularly, in the example of FIG. 4, the graph 150 demonstrates a phase accumulator value that can correspond to consecutive inputs to the phase-to-amplitude LUT 104 on the Y-axis, and demonstrates consecutive sample numbers on the X-axis. In the example of FIG. 4, the phase accumulator value is demonstrated as having a maximum quantity of thirty-one (demonstrated as the greatest value of the phase accumulator in the graph), but it is to be understood that the LUT 104 can have greater or fewer entries. The graph 150 can correspond to the operation of the NCO 68 of the second DAC system 62.

The graph 150 demonstrates a first time duration at 152 in which the consecutive samples (e.g., six consecutive samples) are provided to generate six consecutive phase accumulator values (e.g., via the phase-accumulator 102), and thus corresponding to a step-size of one. Therefore, the consecutive phase-accumulator values in the first time duration 152 correspond to accessing consecutive entries of the LUT 104. As a result, during the first time duration 152, the first control word $FCW_1$ can provide a step-size to the first DAC system 52 that can correspond to a first sampling frequency, and the second control word $FCW_2$ can correspond to a step-size to the second DAC system 54 of one step.

The graph 150 also demonstrates a second time duration at 154. As an example, the frequency synthesis system 50 can switch from the first time duration 152 to the second time duration 154 based on the count value CNT of the counter 54. During the second time duration 154, the consecutive samples (e.g., six consecutive samples) are provided to generate six phase accumulator values (e.g., via the phase-accumulator 102) that correspond to a step-size of two. In other words, the phase-accumulator value increases by two, as opposed to an increase of one during the first time duration 152, at each consecutive sample. Therefore, the phase-accumulator values in the second time duration 154 correspond to accessing every other entry of the LUT 104. As a result, during the second time duration 154, the first control word $FCW_1$ can provide a step-size to the first DAC system 52 that can correspond to a second sampling frequency that is half the sampling frequency in the first time duration 152, and the second control word $FCW_2$ can correspond to a step-size to the second DAC system 54 of two steps (e.g., double the step-size of the first time duration).

In the example of FIG. 4, the frequency synthesis system 50 thus alternates between the first and second time durations 152 and 154, such as to provide six samples (e.g., to the DAC 70) in each time duration to generate the analog output signal $OUT_F$. In the example of FIG. 4, the phase-accumulator value is demonstrated as rolling over and returning to zero in response to the phase-accumulator value exceeding thirty. Accordingly, the graph 150 demonstrates the changes in the phase-accumulator values in each consecutive sample with respect to the NCO 68 in each of the first and second time durations.

Figure 5:
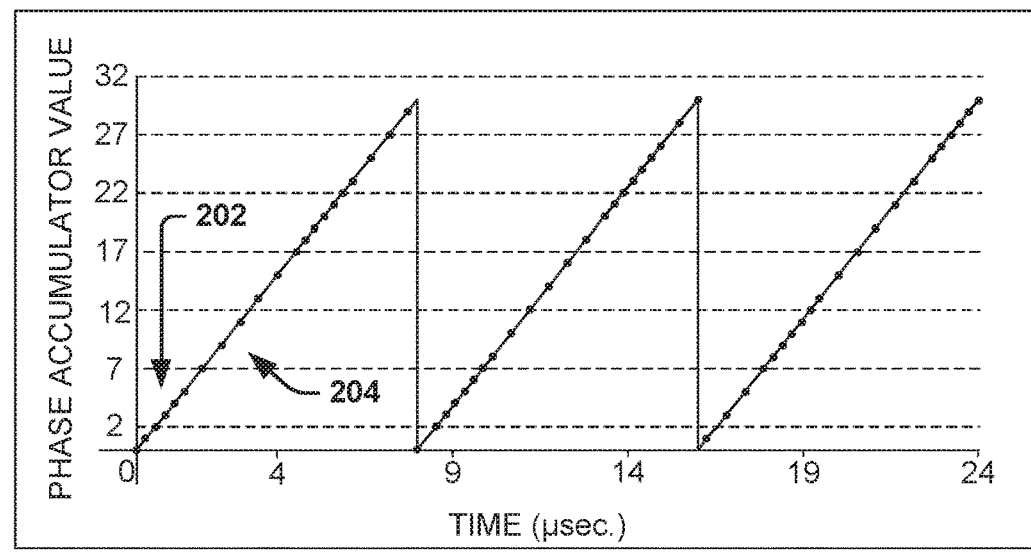
FIG. 5 illustrates an example graph of phase accumulator value versus time for a frequency synthesis system.

FIG. 5 illustrates an example graph 200 of phase accumulator value versus time for a frequency synthesis system (e.g., the frequency synthesis system 50). Particularly, in the example of FIG. 5, the graph 200 demonstrates a phase accumulator value that can correspond to consecutive inputs to the phase-to-amplitude LUT 104 on the Y-axis, and demonstrates time (e.g., in microseconds) on the X-axis. In the example of FIG. 5, the graph 200 can correspond to the operation of the frequency synthesis system 50 for which the graph 150 in the example of FIG. 4 is also associated. Therefore, the graph 200 can correspond to the operation of the NCO 68 of the second DAC system 62.

The graph 200 demonstrates a first time duration at 202 in which the consecutive samples (e.g., six consecutive samples) are provided to generate six consecutive phase accumulator values (e.g., via the phase-accumulator 102), and thus corresponding to a step-size of one. Therefore, the consecutive phase-accumulator values in the first time duration 202 correspond to accessing consecutive entries of the LUT 104. As a result, during the first time duration 202, the first control word $FCW_1$ can provide a step-size to the first DAC system 52 that can correspond to a first sampling frequency, and the second control word $FCW_2$ can correspond to a step-size to the second DAC system 54 of one step.

The graph 200 also demonstrates a second time duration at 204. As an example, the frequency synthesis system 50 can switch from the first time duration 202 to the second time duration 204 based on the count value CNT of the counter 54. During the second time duration 204, the consecutive samples (e.g., six consecutive samples) are provided to generate six phase accumulator values (e.g., via the phase-accumulator 102) that correspond to a step-size of two. In other words, the phase-accumulator value increases by two, as opposed to an increase of one during the first time duration 202, at each consecutive sample. Therefore, the phase-accumulator values in the second time duration 204 correspond to accessing every other entry of the LUT 104. As a result, during the second time duration 204, the first control word $FCW_1$ can provide a step-size to the first DAC system 52 that can correspond to a second sampling frequency that is half the sampling frequency in the first time duration 202, and the second control word $FCW_2$ can correspond to a step-size to the second DAC system 54 of two steps (e.g., double the step-size of the first time duration).

In the example of FIG. 5, the frequency synthesis system 50 thus alternates between the first and second time durations 202 and 204, such as to provide six samples (e.g., to the DAC 70) in each time duration to generate the analog output signal $OUT_F$. Because the sampling frequency of the analog sampling signal $F_S$ provided to the second DAC system 54, as defined by the first control word $FCW_1$, is inversely proportional to the step-size defined by the second control word $FCW_2$. Therefore, the timing at which the samples are provided to the DAC 70 from the NCO 68 is half as frequent in the second time duration 204 as the samples provided to the DAC 70 in the first duration 202. Therefore, in the example of FIG. 5, the samples are provided over time in a linear manner in each of the first and second time durations 202 and 204. Accordingly, the graph 200 demonstrates the changes in the phase-accumulator values over time in each of the first and second time durations 202 and 204.

Figure 6:
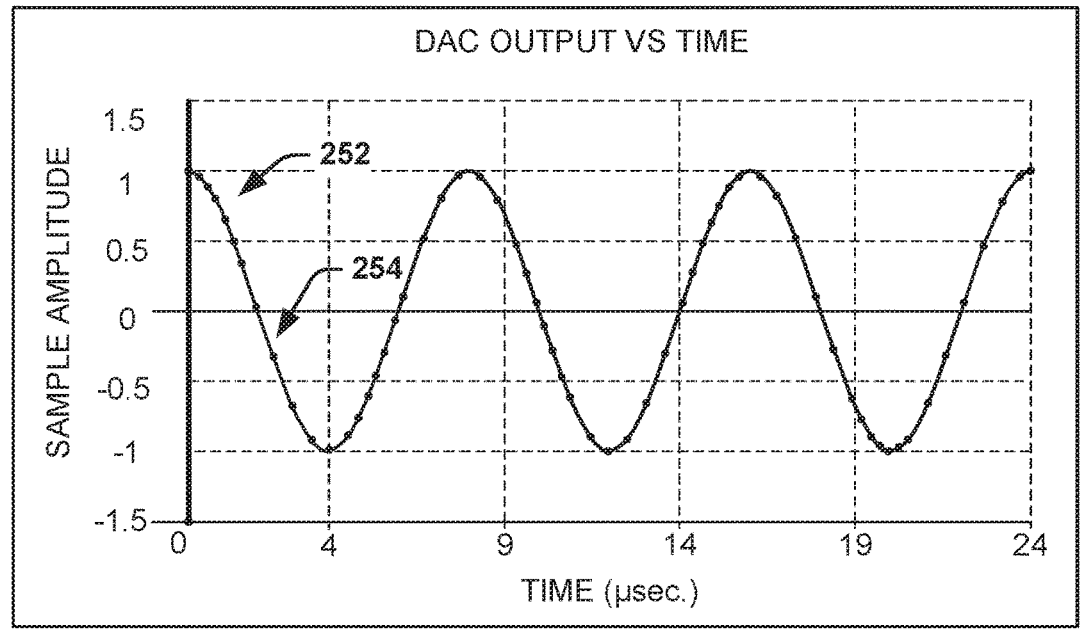
FIG. 6 illustrates an example graph of DAC output versus time for a frequency synthesis system.

FIG. 6 illustrates an example graph 250 of DAC output versus time for a frequency synthesis system (e.g., the frequency synthesis system 50). Particularly, in the example of FIG. 6, the graph 250 demonstrates the amplitude of the digital samples, such as provided from the NCO 68, that correspond to the analog output signal $OUT_F$ on the Y-axis, and demonstrates time (e.g., in microseconds) on the X-axis. In the example of FIG. 6, the graph 250 can correspond to the operation of the frequency synthesis system 50 for which the graphs 150 and 200 in the examples of FIGS. 4 and 5, respectively, are also associated. Therefore, the graph 250 can correspond to the operation of the NCO 68 of the second DAC system 62. The graph 250 demonstrates that the analog output signal $OUT_F$ is a sinusoidal signal. However, it is to be understood that the analog output signal $OUT_F$ can correspond to any of a variety of periodic signals.

The graph 250 demonstrates a first time duration at 252 in which the consecutive samples (e.g., six consecutive samples) are provided to generate six samples that can correspond to consecutive phase-accumulator values (e.g., via the phase-accumulator 102), and thus corresponding to a step-size of one. Therefore, the consecutive samples in the first time duration 252 correspond to accessing consecutive entries of the LUT 104. As a result, during the first time duration 252, the first control word $FCW_1$ can provide a step-size to the first DAC system 52 that can correspond to a first sampling frequency, and the second control word $FCW_2$ can correspond to a step-size to the second DAC system 54 of one step.

The graph 250 also demonstrates a second time duration at 254. As an example, the frequency synthesis system 50 can switch from the first time duration 252 to the second time duration 254 based on the count value CNT of the counter 54. During the second time duration 254, the consecutive samples (e.g., six consecutive samples) are provided to generate six phase accumulator values (e.g., via the phase-accumulator 102) that correspond to a step-size of two. In other words, the phase-accumulator value increases by two, as opposed to an increase of one during the first time duration 252, at each consecutive sample. Therefore, the samples in the second time duration 254 correspond to accessing every other entry of the LUT 104. As a result, during the second time duration 254, the first control word $FCW_1$ can provide a step-size to the first DAC system 52 that can correspond to a second sampling frequency that is half the sampling frequency in the first time duration 252, and the second control word $FCW_2$ can correspond to a step-size to the second DAC system 54 of two steps (e.g., double the step-size of the first time duration).

In the example of FIG. 6, the frequency synthesis system 50 thus alternates between the first and second time durations 252 and 254, such as to provide six samples (e.g., to the DAC 70) in each time duration to generate the analog output signal $OUT_F$. Because the sampling frequency of the analog sampling signal $F_S$ provided to the second DAC system 54, as defined by the first control word $FCW_1$, is inversely proportional to the step-size defined by the second control word $FCW_2$. Therefore, the timing at which the samples are provided to the DAC 70 from the NCO 68 is half as frequent in the second time duration 254 as the samples provided to the DAC 70 in the first duration 252. Therefore, in the example of FIG. 6, the samples are provided over time in a linear manner in each of the first and second time durations 252 and 254. Accordingly, the graph 250 demonstrates the distribution of the samples of the digital version of the analog output signal over time in each of the first and second time durations 252 and 254.

Figure 7:
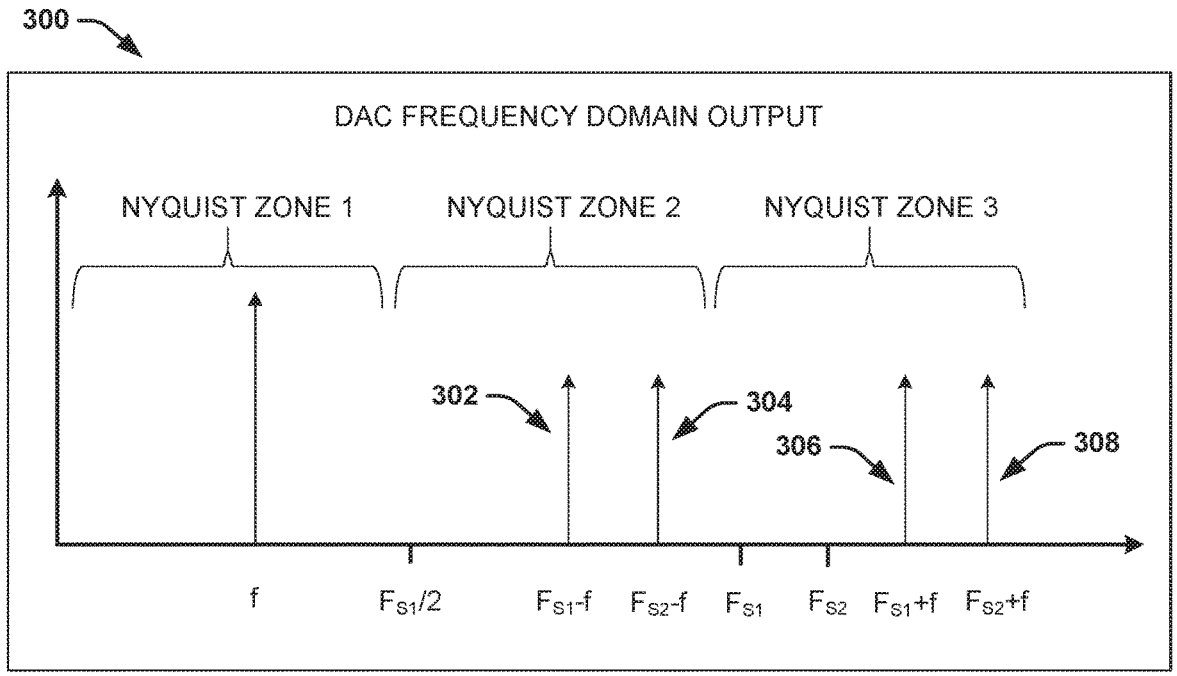
FIG. 7 illustrates an example graph of frequency domain for a frequency synthesis system.

FIG. 7 illustrates an example graph 300 of frequency domain for a frequency synthesis system (e.g., the frequency synthesis system 50). The graph 300 demonstrates frequency on the X-axis, and demonstrates power on the Y-axis. Therefore, the graph 300 demonstrates a power distribution of the analog output signal $OUT_F$, as well as aliases associated with the analog output signal $OUT_F$ with respect to the first and second sampling frequencies of the analog sampling signal $F_S$.

The graph 300 demonstrates a frequency "f" that can correspond to the predetermined output frequency of the analog output signal $OUT_F$. The graph 300 also demonstrates the first sampling frequency $F_{S1}$ and the second sampling frequency $F_{S2}$ of the analog sampling signal $F_S$. The graph also demonstrates three Nyquist zones, including a first Nyquist zone "NYQUIST ZONE 1", a second Nyquist zone "NYQUIST ZONE 2", and a third Nyquist zone "NYQUIST ZONE 3", that are defined by the first sampling frequency $F_{S1}$. Particularly, the first Nyquist zone is defined from zero frequency (e.g., DC) to $F_{S1}/2$, the second Nyquist zone is defined from $F_{S1}/2$ to $F_{S1}$, and the third Nyquist zone $F_{S1}$ to $3*F_{S1}/2$.

In the example of FIG. 3, the predetermined output frequency f is less than $F_{S1}/2$, and thus occupies the first Nyquist zone. Therefore, the predetermined output frequency f is less than the Nyquist frequency. The graph 300 also demonstrates alias signals associated with each of the first sampling frequency $F_{S1}$ and the second sampling frequency $F_{S2}$. Particularly, a first alias signal 302 is demonstrated at a frequency $F_{S1}$-f and a second alias signal 304 is demonstrated at a frequency $F_{S2}$-f in the second Nyquist zone. Additionally, a third alias signal 306 is demonstrated at a frequency $F_{S1}$+f and a fourth alias signal 308 is demonstrated at a frequency $F_{S2}$+f in the third Nyquist zone. Therefore, in response to the analog output signal $OUT_F$ being generated based on the analog sampling signal $F_S$ at the first sampling frequency $F_{S1}$, the frequency synthesis system 50 can likewise generate the first and third alias signals 302 and 306, and in response to the analog output signal $OUT_F$ being generated based on the analog sampling signal $F_S$ at the second sampling frequency $F_{S2}$, the frequency synthesis system 50 can likewise generate the second and fourth alias signals 304 and 308.

As described herein, the counter 52 can be configured to define the first and second time durations between which the analog sampling signal $F_S$ switches between the respective first and second sampling frequencies $F_{S1}$ and $F_{S2}$. Therefore, the generated alias signals likewise switch between the first and third alias signals 302 and 306 during the first time duration and the second and fourth alias signals 304 and 308 during the second time duration. Therefore, the power density of the alias signals 302, 304, 306, and 308 is reduced over time (e.g., by approximately one half for equal length first and second time durations). As a result, the filtering of the alias signals 302, 304, 306, and 308 via filters (e.g., at the output of the frequency synthesis system 50) can be rendered substantially more efficient, as the power density of the alias signals 302, 304, 306, and 308 in the respective frequency bands defined by the Nyquist zones is reduced.

As another example, the frequency synthesis system 50 can be configured to allow for a higher frequency analog output signal $OUT_F$, such as generated by relatively lower sampling frequencies of the analog sampling signal $F_S$. For example, for a more simplistic periodic analog output signal (e.g., a sinusoidal signal), operating the frequency synthesis system 50 above the Nyquist frequency can be achieved in a manner that also facilitates more efficient filtering of the resulting alias signals, and also allows the frequency synthesis system 50 to operate more efficiently (e.g., at lower power by decreasing the sampling frequencies relative to the generated analog output signal $OUT_F$).

Figure 8:
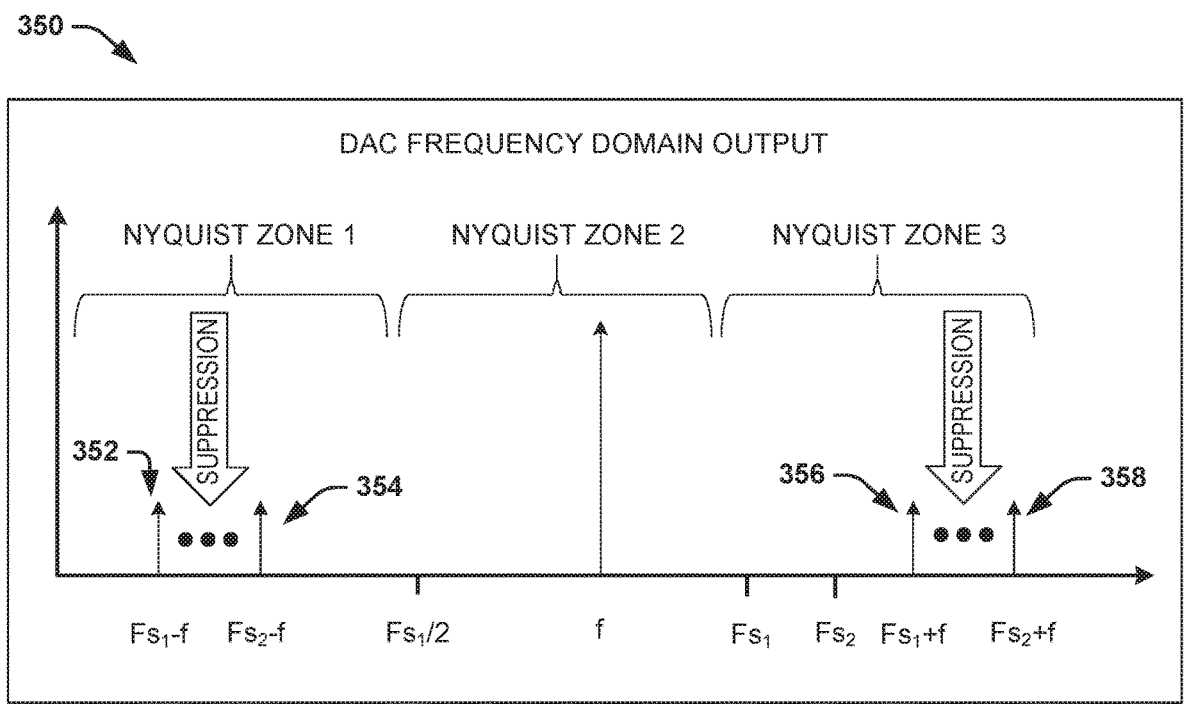
FIG. 8 illustrates another example graph of frequency domain for a frequency synthesis system.

FIG. 8 illustrates another example graph 350 of frequency domain for a frequency synthesis system (e.g., the frequency synthesis system 50). The graph 350 demonstrates frequency on the X-axis, and demonstrates power on the Y-axis. Therefore, the graph 350 demonstrates a power distribution of the analog output signal $OUT_F$, as well as aliases associated with the analog output signal $OUT_F$ with respect to the first and second sampling frequencies of the analog sampling signal $F_S$.

The graph 350 demonstrates a frequency "f" that can correspond to the predetermined output frequency of the analog output signal $OUT_F$. The graph 350 also demonstrates the first sampling frequency $F_{S1}$ and the second sampling frequency $F_{S2}$ of the analog sampling signal $F_S$. The graph also demonstrates three Nyquist zones, including a first Nyquist zone "NYQUIST ZONE 1", a second Nyquist zone "NYQUIST ZONE 2", and a third Nyquist zone "NYQUIST ZONE 3", that are defined by the first sampling frequency $F_{S1}$. Particularly, the first Nyquist zone is defined from zero frequency (e.g., DC) to $F_{S1}/2$, the second Nyquist zone is defined from $F_{S1}/2$ to $F_{S1}$, and the third Nyquist zone $F_{S1}$ to $3*F_{S1}/2$.

In the example of FIG. 3, the predetermined output frequency f is greater than $F_{S1}/2$, and thus occupies the second Nyquist zone. Therefore, the predetermined output frequency f is greater than the Nyquist frequency. The graph 350 also demonstrates alias signals associated with each of the first sampling frequency $F_{S1}$ and the second sampling frequency $F_{S2}$. Particularly, a first alias signal 352 is demonstrated at a frequency $F_{S1}$-f and a second alias signal 354 is demonstrated at a frequency $F_{S2}$-f in the first Nyquist zone. Additionally, a third alias signal 356 is demonstrated at a frequency $F_{S1}$+f and a fourth alias signal 358 is demonstrated at a frequency $F_{S2}$+f in the third Nyquist zone. Therefore, in response to the analog output signal $OUT_F$ being generated based on the analog sampling signal $F_S$ at the first sampling frequency $F_{S1}$, the frequency synthesis system 50 can likewise generate the first and third alias signals 352 and 356, and in response to the analog output signal $OUT_F$ being generated based on the analog sampling signal $F_S$ at the second sampling frequency $F_{S2}$, the frequency synthesis system 50 can likewise generate the second and fourth alias signals 354 and 358.

Similar to as described previously, the counter 52 can be configured to define the first and second time durations between which the analog sampling signal $F_S$ switches between the respective first and second sampling frequencies $F_{S1}$ and $F_{S2}$. Therefore, the generated alias signals likewise switch between the first and third alias signals 352 and 356 during the first time duration and the second and fourth alias signals 354 and 358 during the second time duration. Therefore, the power density of the alias signals 352, 354, 356, and 358 is suppressed over time (e.g., by approximately one half for equal length first and second time durations).

As a result, the filtering of the alias signals 352, 354, 356, and 358 via filters (e.g., at the output of the frequency synthesis system 50) can be rendered substantially more efficient, as the power density of the alias signals 352, 354, 356, and 358 in the respective frequency bands defined by the Nyquist zones is reduced. Additionally, as described previously, while the discussion herein describes only two time durations, and thus two respective sampling frequencies, it is to be understood that additional time durations and additional respective sampling frequencies can be implemented. For example, a frequency synthesis system as described herein (e.g., the frequency synthesis system 50) can be configured to sequentially cycle through ten or more different sampling frequencies at ten or more respective time durations, with the amount of suppression of the power distribution of the other Nyquist zones increasing with the addition of more sampling frequencies. Accordingly, the power distribution of the resulting multiple alias signals in each of the respective other Nyquist zones (e.g., outside of the Nyquist zone in which the predetermined output frequency occupies) can be further suppressed based on dithering between the multiple sampling frequencies to generate the analog output signal $OUT_F$.

Figure 9:
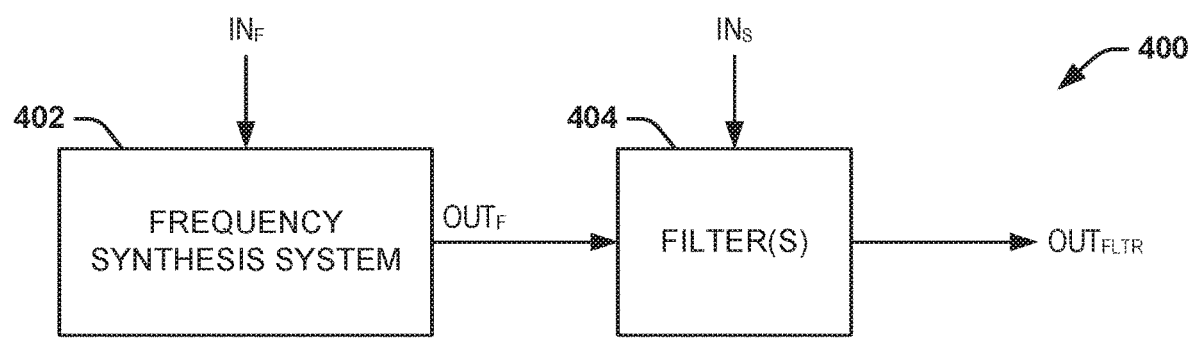
FIG. 9 illustrates yet another example of a frequency synthesis system.

FIG. 9 illustrates yet another example of a system 400. The system 400 includes a frequency synthesis system 402. The frequency synthesis system 402 can be implemented in any of a variety of computer applications to generate the analog output signal $OUT_F$ at a desired output frequency. For example, the analog output signal $OUT_F$ can be provided to generate a carrier signal on which a baseband communication signal can be modulated, or can generate a timing reference signal that can be implemented for a variety of reasons in a computer system. The frequency synthesis system 402 can correspond to the frequency synthesis system 10 and/or the frequency synthesis system 50 in the respective examples of FIGS. 1 and 2. Therefore, the frequency synthesis system 402 can operate in the same manner as described previously to generate the analog output signal $OUT_F$ based on dithering between multiple sampling frequencies.

The system 400 also includes a set of one or more filters 404 that are arranged at the output of the frequency synthesis system 402. The filter(s) 404 can be configured to filter the alias signals that are generated along with the analog output signal $OUT_F$ by the frequency synthesis system 402. For example, the filter(s) 404 can be configured to filter the alias signals from one or more Nyquist zones that include the alias signals. In the example of FIG. 9, the filter(s) 404 are configured to generate an analog output signal $OUT_{FLTR}$ that corresponds to the filtered version of the analog output signal $OUT_F$. As described previously, because of the suppression of the power density of the alias signals, the filter(s) 404 can be implemented as at reduced cost/complexity to achieve sufficient filtering of the alias signals.

For example, in the example of FIG. 9, the frequency synthesis system 402 and the filter(s) 404 are each configured to receive inputs for tuning the operation of the system 400. The frequency synthesis system 402 is configured to receive the input $IN_F$ corresponding to defining the digital control word pairs that can be stored in the memory (e.g., the memory 56) for generating the analog output signal $OUT_F$ at the predetermined output frequency based on multiple sampling frequencies of the analog sampling signal $F_S$, as described herein. For example, the input $IN_F$ can correspond to additional sets of digital control word pairs to be stored in the memory 56 that define a given output frequency of the analog output signal $OUT_F$, and/or can include a selection input that corresponds to a given set of digital control word pairs 58 already stored in the memory 56 to define the given output frequency of the analog output signal $OUT_F$. The filter(s) 404 are configured to receive an input $IN_S$ that can correspond to selectively filtering frequency bands (e.g., Nyquist zones) to provide filtering of the power density suppressed alias signals, as described herein. As a result, the inputs $IN_F$ and $IN_S$ can provide programmability of the operation of the system 400 to generate the analog output signal $OUT_{FLTR}$ that corresponds to an analog signal at a predefined output frequency that is substantially free from spurious alias signals in a more efficient manner than typical frequency synthesis systems.

Figure 10:
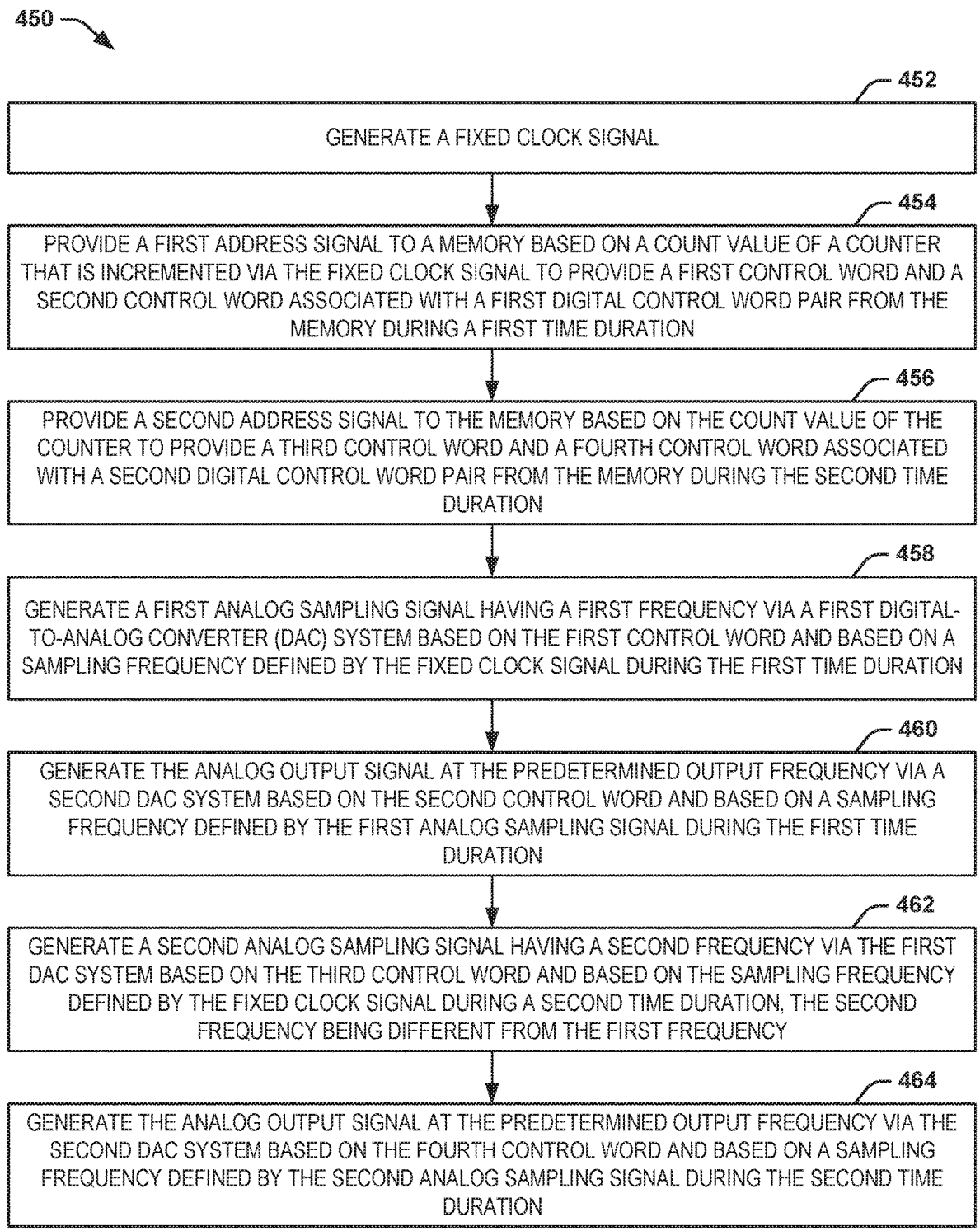
FIG. 10 illustrates an example of a method for generating an analog output signal via a frequency synthesis system.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 450 method for generating an analog output signal (e.g., the analog output signal $OUT_F$) via a frequency synthesis system (e.g., the frequency synthesis system 10). At 452, a fixed clock signal (e.g., the clock signal $F_{CLK}$) is generated. At 454, a first address signal (e.g., the address signal ADR) is provided to a memory (e.g., the memory 56) based on a count value (e.g., the count value CNT) of a counter (e.g., the counter 54) that is incremented via the fixed clock signal to provide a first control word (e.g., the first control word $FCW_1$) and a second control word (e.g., the second control word $FCW_2$) associated with a first digital control word pair (e.g., a first digital control word pair 58) from the memory during a first time duration. At 456, a second address signal (e.g., the address signal ADR) is provided to the memory based on the count value of the counter to provide a third control word (e.g., the first control word $FCW_1$) and a fourth control word (e.g., the second control word $FCW_2$) associated with a second digital control word pair (e.g., a second one of the digital control word pairs 58) from the memory during the second time duration. The first and second digital control word pairs can each be associated with a predetermined output frequency (e.g., the frequency "f").

At 458, a first analog sampling signal (e.g., the analog sampling signal $F_S$) having a first frequency (e.g., the frequency $F_{S1}$) is generated via a first DAC system (e.g., the first DAC system 14) based on the first control word and based on a sampling frequency defined by the fixed clock signal during the first time duration. At 460, the analog output signal is generated at the predetermined output frequency via a second DAC system (e.g., the second DAC system 16) based on the second control word and based on a sampling frequency defined by the first analog sampling signal during the first time duration. At 462, a second analog sampling signal (e.g., the analog sampling signal $F_S$) having a second frequency (e.g., the sampling frequency $F_{S2}$) via the first DAC system based on the third control word and based on the sampling frequency defined by the fixed clock signal during the second time duration. The second frequency can be different from the first frequency. At 464, the analog output signal is generated at the predetermined output frequency via the second DAC system based on the fourth control word and based on a sampling frequency defined by the second analog sampling signal during the second time duration.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A frequency synthesis system comprising:
   a memory having a first digital control word pair and a second digital control word pair stored therein, each of the first and second digital control word pairs comprising a first control word and a second control word;
   a first digital-to-analog converter (DAC) system coupled to a clock to receive a fixed clock signal at a clock input of the first DAC system and coupled to the memory at an input of the first DAC system to receive the first control word of the first digital control word pair during a first time duration and generate an analog sampling signal having a first sampling frequency at an output of the first DAC system, and to receive the first control word of the second digital control word pair during a second time duration and generate the analog sampling signal having a second sampling frequency at the output of the first DAC system; and
   a second DAC system coupled to the output of the first DAC system at a clock input of the second DAC system and coupled to the memory at an input to receive the second control word of the second digital control word pair during the first time duration and generate an analog output signal at an output of the second DAC system, and to receive the second control word of the second digital control word pair during the second time duration and generate the analog output signal at the output of the second DAC system, wherein the analog output signal has a same predetermined output frequency at both the first time duration and the second time duration.

2. The system of claim 1, further comprising a counter coupled to the memory and coupled to an output of the clock, the counter comprising a count value that is incremented based on a predetermined number of cycles of the fixed clock signal to define the first time duration and the second time duration.

3. The system of claim 2, wherein the counter is to provide address signals to the memory based on the count value to provide the first digital control word pair during the first time duration and to provide the second digital control word pair during the second time duration.

4. The system of claim 3, wherein the counter is to provide the address signals to periodically cycle between the first digital control word pair during the first time duration and the second digital control word pair during the second time duration based on the count value.

5. The system of claim 1, wherein the first DAC system comprises:

a first numerically controlled oscillator (NCO) coupled to the memory and to the clock and being to generate a first digital signal based on the first control word of the first and second digital control word pairs in each of the first time duration and the second time duration, respectively, and based on the fixed clock signal; and a first DAC coupled to the first NCO and the clock being to generate the analog sampling signal in response to the first digital signal based on the sampling frequency defined by the fixed clock signal;

wherein the second DAC system comprises:

a second NCO coupled to the memory and to the first DAC and being to generate a second digital signal based on the second control word of the first and second digital control word pairs in each of the first time duration and the second time duration, respectively, and based on the analog sampling signal; and a second DAC coupled to the second NCO and to the first DAC and being to generate the analog output signal at the predetermined output frequency in each of the first and second time durations based on the second digital signal and based on the sampling frequency defined by the analog sampling signal.

6. The system of claim 5, wherein the first NCO comprises:

a first phase accumulator coupled to receive the first control word to generate a first digital phase signal that is incremented by the first control word at a frequency defined by the fixed clock signal; and a first lookup table (LUT) coupled to the first phase accumulator and comprising a plurality of entries arranged as a digital sinusoidal signal, the first LUT being to generate the first digital signal as a digital sinusoidal signal in response to the first digital phase signal based on a step-size defined by the first control word in each of the first and second digital control word pairs;

wherein the second NCO comprises:

a second phase accumulator to receive the second control word to generate a second digital phase signal that is incremented by the second control word at a frequency defined by the analog sampling signal; and a second LUT coupled to the second phase accumulator and comprising a plurality of entries arranged as a digital representation of the analog output signal, the second LUT being to generate the second digital signal in response to the second digital phase signal based on a step-size defined by the second control word in each of the first and second digital control word pairs.

7. The system of claim 1, wherein the memory is to store a plurality of digital control word pairs associated with each of a respective plurality of time durations, wherein the first DAC system is to generate the analog sampling signal based on the first control word of each of the digital control word pairs in a sequence, the analog sampling signal having one of a plurality of frequencies based on the first control word during each of the respective plurality of time durations, wherein the second DAC system is to generate the analog output signal based on the second control word of each of the digital control word pairs in the sequence and based on a sampling frequency defined by the analog sampling signal in each of the plurality of time durations, the analog output signal being provided at the predetermined output frequency during each of the respective plurality of time durations.

8. The system of claim 1, wherein the predetermined output frequency is a first predetermined output frequency, wherein the memory is to store a third digital control word pair and a fourth digital control word pair associated with a second predetermined output frequency, wherein the memory is selectable between providing the first and second digital control word pairs to the first and second DAC system to provide the analog output signal at the first predetermined output frequency and providing the third and fourth digital control words pairs to the first and second DAC system to provide the analog output signal at the second predetermined output frequency.

9. The system of claim 1, wherein the predetermined output frequency is a first predetermined output frequency, wherein the first and second digital control word pair is a first set of digital control word pairs, wherein the memory is to receive inputs associated with at least one additional set of digital control word pairs associated with at least one additional output frequency, wherein the memory is selectable between providing the first set of digital control word pairs and one of the at least one additional sets of digital control word pairs to the first and second DAC system to provide the analog output signal at a respective one of the first predetermined output frequency and the at least one additional output frequency.

10. The system of claim 1, wherein the first and second digital control word pairs are selected to define the predetermined output frequency and to define operation of the frequency synthesis system in a second or higher Nyquist zone associated with the analog output signal relative to each of the first and second sampling frequencies, such that the frequency synthesis system mitigates a power density of alias signals in each of a plurality of additional Nyquist zones associated with the predetermined output frequency relative to each of the first and second sampling frequencies.

11. The frequency synthesis system of claim 10, further comprising at least one filter coupled to the output of the second DAC system to filter the analog output signal to substantially reduce the alias signals associated with each of the plurality of additional Nyquist zones, the at least one filter being further to receive an input to define the plurality of additional Nyquist zones to be filtered.

12. A method for generating an analog output signal via a frequency synthesis system, the method comprising:

generating a fixed clock signal;

providing a first address signal to a memory based on a count value of a counter that is incremented via the fixed clock signal to provide a first control word and a second control word associated with a first digital control word pair from the memory during a first time duration;

providing a second address signal to the memory based on the count value of the counter to provide a third control word and a fourth control word associated with a second digital control word pair from the memory during a second time duration, the first and second digital control word pairs each being associated with a predetermined output frequency;

generating a first analog sampling signal having a first sampling frequency via a first digital-to-analog converter (DAC) system based on the first control word and based on a sampling frequency defined by the fixed clock signal during the first time duration;

generating the analog output signal at the predetermined output frequency via a second DAC system based on the second control word and based on the first sampling frequency defined by the first analog sampling signal during the first time duration;

generating a second analog sampling signal having a second sampling frequency via the first DAC system based on the third control word and based on the sampling frequency defined by the fixed clock signal during the second time duration, the second sampling frequency being different from the first sampling frequency; and generating the analog output signal at the predetermined output frequency via the second DAC system based on the fourth control word and based on the second sampling frequency defined by the second analog sampling signal during the second time duration.

13. The method of claim 12, wherein providing the first address signal and the second address signal comprises periodically cycling between the first address signal and the second address signal in each of the respective first and second time durations based on the count value.

14. The method of claim 12, wherein generating the first analog sampling signal comprises:

generating a first digital signal via a first numerically controlled oscillator (NCO) based on the first control word and based on the fixed clock signal in the first time duration; and generating the first analog sampling signal via a first DAC in response to the first digital signal based on the sampling frequency defined by the fixed clock signal;

wherein generating the second analog sampling signal comprises:

generating a second digital signal via the first NCO based on the third control word and based on the fixed clock signal in the second time duration; and generating the second analog sampling signal in response to the second digital signal based on the sampling frequency defined by the fixed clock signal;

wherein generating the analog output signal comprises:

generating a third digital signal via a second NCO based on the second control word and the analog sampling signal in the first time duration and based on the fourth control word and the analog sampling signal in the second time duration;

generating the analog output signal at the predetermined output frequency via a second DAC based on the third digital signal, based on the first sampling frequency in the first time duration and based on the second sampling frequency in the second time duration.

15. The method of claim 12, further comprising storing a plurality of digital control word pairs associated with each of a respective plurality of time durations in a respective plurality of memory addresses in the memory, wherein providing the first address signal and the second address signal comprises providing a plurality of address signals to the memory in each of the respective plurality of time durations to periodically cycle between the plurality of address signals in each of the respective plurality of time durations based on the count value.

16. The method of claim 12, wherein the predetermined output frequency is a first predetermined output frequency, the method further comprising:

storing a plurality of digital control word pair sets in the memory, each of the plurality of digital control word pair sets being associated with one of a respective plurality of predetermined output frequencies; and selecting one of the plurality of digital control word pair sets to implement the method for generating the analog output signal at the given one of the respective plurality of predetermined output frequencies.

17. The method of claim 12, further comprising selecting the first and second digital control word pairs to define the predetermined output frequency and to define operation of the frequency synthesis system in a second or higher Nyquist zone associated with the analog output signal relative to each of the first and second sampling frequencies, and to mitigate a power density of alias signals in each of a plurality of additional Nyquist zones associated with the predetermined output frequency relative to each of the first and second sampling frequencies.

18. The method of claim 17, further comprising providing an input to at least one filter, the input defining the plurality of additional Nyquist zones to substantially reduce the alias signals associated with each of the plurality of additional Nyquist zones via the filter.

19. A frequency synthesis system comprising:

a counter comprising a count value that is incremented based on a predetermined number of cycles of a fixed clock signal to define and cycle between a plurality of time durations;

a memory coupled to receive address signals from the counter, the address signals being associated with accessing a plurality of digital control word pairs stored in the memory, each of the digital control word pairs comprising a first control word and a second control word, the first and second control words for each of the digital control word pairs having respective different values relative to other digital control word pairs and being associated with a same predetermined output frequency;

a first numerically controlled oscillator (NCO) coupled to receive the fixed clock signal from a clock and to receive the first control word from each of the digital control word pairs in each of the respective plurality of time durations in a sequence to generate a first digital signal;

a first digital to analog converter (DAC) coupled to receive the first digital signal to generate an analog sampling signal, the analog sampling signal having a different frequency during each of the plurality of time durations in the sequence;

a second NCO coupled to receive the analog sampling signal from the first DAC and to receive the second control word from each of the digital control word pairs in each of the respective plurality of time durations in the sequence to generate a second digital signal; and a second DAC coupled to receive the second digital signal to generate an analog output signal at an output at the same predetermined output frequency in each of the plurality of time durations.

20. The system of claim 19, wherein the first NCO comprises:

a first phase accumulator coupled to receive the first control word and to generate a first digital phase signal that is incremented by the first control word at a frequency defined by the fixed clock signal; and a first lookup table (LUT) coupled to receive the first digital phase signal and comprising a plurality of entries arranged as a digital sinusoidal signal to generate the first digital signal as a digital sinusoidal signal in response to the first digital phase signal based on a step-size defined by the first control word in each of the digital control word pairs;

wherein the second NCO comprises:

a second phase accumulator coupled to receive the second control word and to generate a second digital phase signal that is incremented by the second control word at a frequency defined by the analog sampling signal; and a second LUT coupled to receive the second digital phase signal and comprising a plurality of entries arranged as a digital representation of the analog output signal to generate the second digital signal in response to the second digital phase signal based on a step-size defined by the second control word in each of the digital control word pairs.

* * * * *